United States Patent [19]
Blauvelt

[11] Patent Number: 5,363,056
[45] Date of Patent: Nov. 8, 1994

[54] CIRCUIT FOR LINEARIZATION OF AMPLIFIED ELECTRONIC SIGNALS

[75] Inventor: Henry A. Blauvelt, San Marino, Calif.

[73] Assignee: Ortel Corporation, Alhambra, Calif.

[21] Appl. No.: 54,868

[22] Filed: Apr. 27, 1993

Related U.S. Application Data

[63] Continuation-in-part of Ser. No. 918,623, Jul. 21, 1992, Pat. No. 5,252,930, which is a continuation-in-part of Ser. No. 653,003, Feb. 8, 1991, Pat. No. 5,132,639, which is a continuation-in-part of Ser. No. 404,186, Sep. 7, 1989, Pat. No. 4,992,754.

[51] Int. Cl.$^5$ .......................... H03F 3/28; H01H 7/14
[52] U.S. Cl. ................................. 330/118; 330/149; 330/290; 330/151
[58] Field of Search ................. 330/54, 55, 118, 122, 330/149, 290, 151, 124 D, 124 R

[56] References Cited

U.S. PATENT DOCUMENTS

| | | | |
|---|---|---|---|
| 3,422,368 | 1/1969 | Julie | 330/118 |
| 3,571,742 | 3/1971 | Wengenroth | 330/54 |
| 3,665,333 | 5/1972 | Yastrov | 330/53 |
| 5,017,886 | 5/1991 | Geller | 330/55 |

FOREIGN PATENT DOCUMENTS 1147231 4/1969 United Kingdom .

*Primary Examiner*—William L. Sikes
*Assistant Examiner*—Fetsum Abraham
*Attorney, Agent, or Firm*—Christie, Parker & Hale

[57] ABSTRACT

An electronic circuit provides a linear output from an amplifying device, such as a hybrid push-pull amplifier, which has inherent distortion. In a preferred embodiment, the distortion of the hybrid amplifier is compensated by nesting a pair of hybrid push-pull amplifiers within a push-pull circuit configuration. In another embodiment, the distortion of the hybrid amplifier is compensated by providing a predistorted signal equal in magnitude, but opposite in sign, to the distortion introduced by the nonlinear device. The input signal is split into two electrical paths with the primary part of the signal applied directly to the hybrid amplifier, with a time delay to compensate for delay in the secondary path. Elements within the secondary path generate both even and odd order distortion products. These are recombined with the primary signal in proper phase and amplitude, and the resulting signal is applied to the hybrid amplifier for canceling distortion in the hybrid amplifier.

13 Claims, 2 Drawing Sheets

5,363,056

CIRCUIT FOR LINEARIZATION OF AMPLIFIED ELECTRONIC SIGNALS

CROSS-REFERENCE TO RELATED APPLICATIONS

This application is a continuation-in-part of U.S. patent application Ser. No. 07/918,623, filed Jul. 21, 1992, U.S. Pat. No. 5,252,930 which is a continuation-in-part of U.S. patent application Ser. No. 07/653,003, filed Feb. 8, 1991, now U.S. Pat. No. 5,132,639, which is a continuation-in-part of U.S. patent application Ser. No. 07/404,186, filed Sep. 7, 1989, now U.S. Pat. No. 4,992,754. The subject matter of these prior applications is hereby incorporated by reference.

FIELD OF THE INVENTION

This invention relates generally to amplifiers and, more particularly, to circuits for linearization of electronic signals produced by hybrid push-pull amplifiers.

BACKGROUND OF THE INVENTION

Push-pull amplifiers are among the most commonly used amplifiers for reducing distortion in electrical signals. Although the conventional push-pull amplifier has the advantage of simple design, it only serves to significantly reduce even-order distortion. Further, to achieve optimal reduction of even-order distortion, the components which comprise the prior art push-pull amplifier must be closely matched and carefully balanced. In come cases, this matching and balancing of components is impractical and imprecise.

In other applications, not only second-order distortion, but third-order distortion should be suppressed to accommodate the particular application in which the signal is being used. These applications include multichannel video transmission, which requires excellent linearity to prevent channels from interfering with each other. An amplifier circuit which produces linearized signals has wide application in commercial TV transmission, CATV, interactive TV, and video telephone transmission.

Linearization of amplified signals has been studied for some time, but proposed solutions suffer from practical disadvantages. Matching and balancing components in the prior art push-pull amplifier can be expensive, time-consuming, and imprecise. In some cases which achieve highly linear signals, several adjustable circuit elements have been used to compensate for imprecise component matching, but these additional parts add to the size of the circuit and increase its cost. Furthermore, most of the prior designs do not even consider third-order distortion.

The present invention accordingly is addressed to these and other difficulties found in the prior art.

SUMMARY OF THE INVENTION

Thus, in practice of this invention according to a presently preferred embodiment, a nested push-pull amplifier for reducing distortion in an amplified output signal splits an input signal into two electrical paths. Each electrical path contains a hybrid push-pull amplifier for amplifying the input signal. The hybrid push-pull amplifiers generate unwanted second-order distortion due to imperfect matching and balancing of the amplifiers. The output signals from each hybrid amplifier in each path are recombined to generate a single output signal having minimum second-order distortion. With this circuit, it is not necessary to precisely match the components in each hybrid amplifier, although doing so may serve to further minimize second-order distortion for applications which require highly linearized signals.

Third-order distortion in hybrid amplifiers is reduced in the present invention by a predistortion circuit for a hybrid amplifier. It has been found that commercially available hybrid amplifiers exhibit third-order distortion characteristics which are highly reproducible from unit to unit. Therefore, the amplifiers are well-suited to linearization by distortion techniques without the need for extensive tuning.

Thus, in the present invention, the distortion of the hybrid amplifier is compensated by providing a predistorted signal equal in magnitude, but opposite in sign, to the inherent distortion produced by the amplifier. The circuit includes a coupler for splitting an input signal into primary and secondary electrical paths. The primary electrical path contains a delay block to produce the optimum phase relationship between the fundamental signals and the distortion generated in the secondary path. Elements within the secondary path generate even-order and odd-order distortion products. The signal from the secondary path is recombined with the primary signal in a second coupler, and the resulting signal is applied to the hybrid amplifier for canceling distortion.

BRIEF DESCRIPTION OF THE DRAWINGS

These and other features and advantages of this invention will be better understood and more fully appreciated by reference to the following detailed description when considered in conjunction with the accompanying drawings wherein.

DETAILED DESCRIPTION

Figure 1:
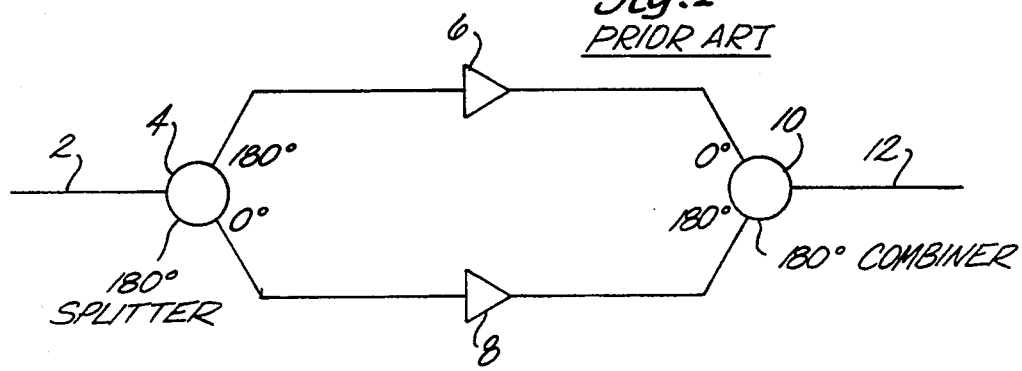
FIG. 1 is a block diagram of a prior art push-pull amplifier.

Referring to FIG. 1, a prior art push-pull amplifier includes an input path 2 connected to a 180° splitter 4. The 180° splitter splits the input signal into two signals which are 180° out of phase with one another. The split signals are applied to two amplifier sections 6, 8, respectively. The output signals of the amplifiers are then recombined in a 180° combiner 10 to produce an output signal in an output path 12 having reduced second-order distortion. Even-order distortion products at the output of each amplifier are in phase with each other, and, when recombined, only the difference between the two signal paths remains, thus cancelling the second order distortion products.

Ideally, the amplifier sections are perfectly matched and the splitter and combiner are ideal to produce perfect cancellation of even-order distortion products. In practice, however, limitations on precise component matching and the performance of the splitter and combiner prevent this ideal cancellation from being achieved.

Figure 2:
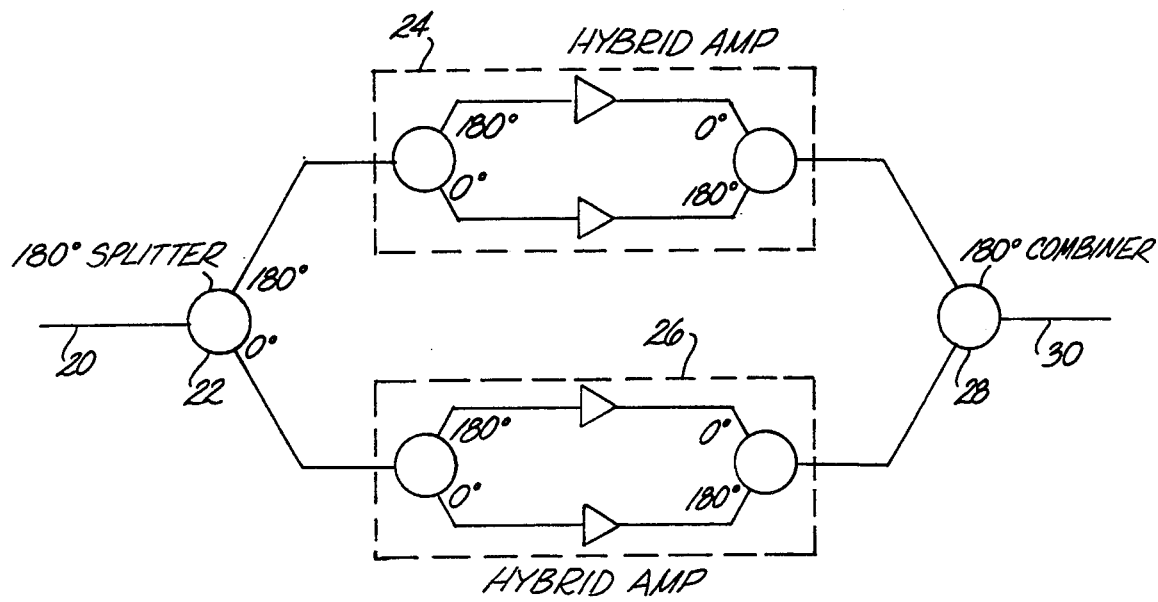
FIG. 2 is a block diagram of a nested push-pull amplifier according to the present invention.

Referring to FIG. 2, a nested push-pull amplifier according to the present invention is shown for reducing distortion without perfect component matching.

The nested push-pull amplifier includes an input path 20 connected to a 180° splitter 22. The splitter splits the input signal into two signals 180° out of phase, which are applied individually to a pair of hybrid push-pull amplifiers 24, 26. The hybrid push-pull amplifiers are substantially similar to the push-pull amplifier of FIG. 1. The output signals of the two hybrid amplifiers are then recombined in a 180° combiner 28 to produce an output signal in an output path 30 (e.g., a coaxial cable) having significantly reduced second-order distortion.

For a nested push-pull design to be effective, the hybrid amplifiers must have similar second order distortion characteristics. Best results are obtained by sorting amplifiers to improve the matching. Second order distortion caused by amplifiers can be measured in terms of amplitude and phase which may vary with frequency. Ideally, the amplitude and phase of the second order distortion of the hybrid amplifiers used would be matched at all frequencies. In practice, matching the amplitudes at one frequency is sufficient to result in very significant second order distortion reduction over a wide range of frequencies. In practice, a substantial reduction of second order distortion is achieved even for randomly chosen hybrid amplifiers.

The nested push-pull amplifier also provides a high power output. Thus, the output may be split to two or more output paths, if desired. The nested push-pull amplifier can also readily be used as a cable TV booster for maintaining a CATV signal over long distances.

The prior art push-pull amplifier and the nested push-pull amplifier according to the present invention serve only to reduce second-order distortion. These amplifiers have no internal linearization design features for minimizing third-order distortion. In practice, third-order distortion may be detrimental to applications such as multi-channel video networks which require highly linear signals.

It has been found that commercially available hybrid CATV amplifiers exhibit third-order distortion characteristics which are highly reproducible from unit to unit. Because this third-order distortion is highly reproducible, the amplifiers are well-suited to linearization by predistortion techniques without the need for extensive tuning.

In some cases, it is preferable to achieve linearization of second-order distortion and third-order distortion simultaneously through the use of predistortion techniques. This would be preferred in cases, for example, where only one hybrid amplifier is desirable, thus making the nested push-pull design impractical. One approach is to use two distortion arms, one for second-order and one for third-order. However, this usually entails an increased number of components which unduly increases costs.

Figure 3:
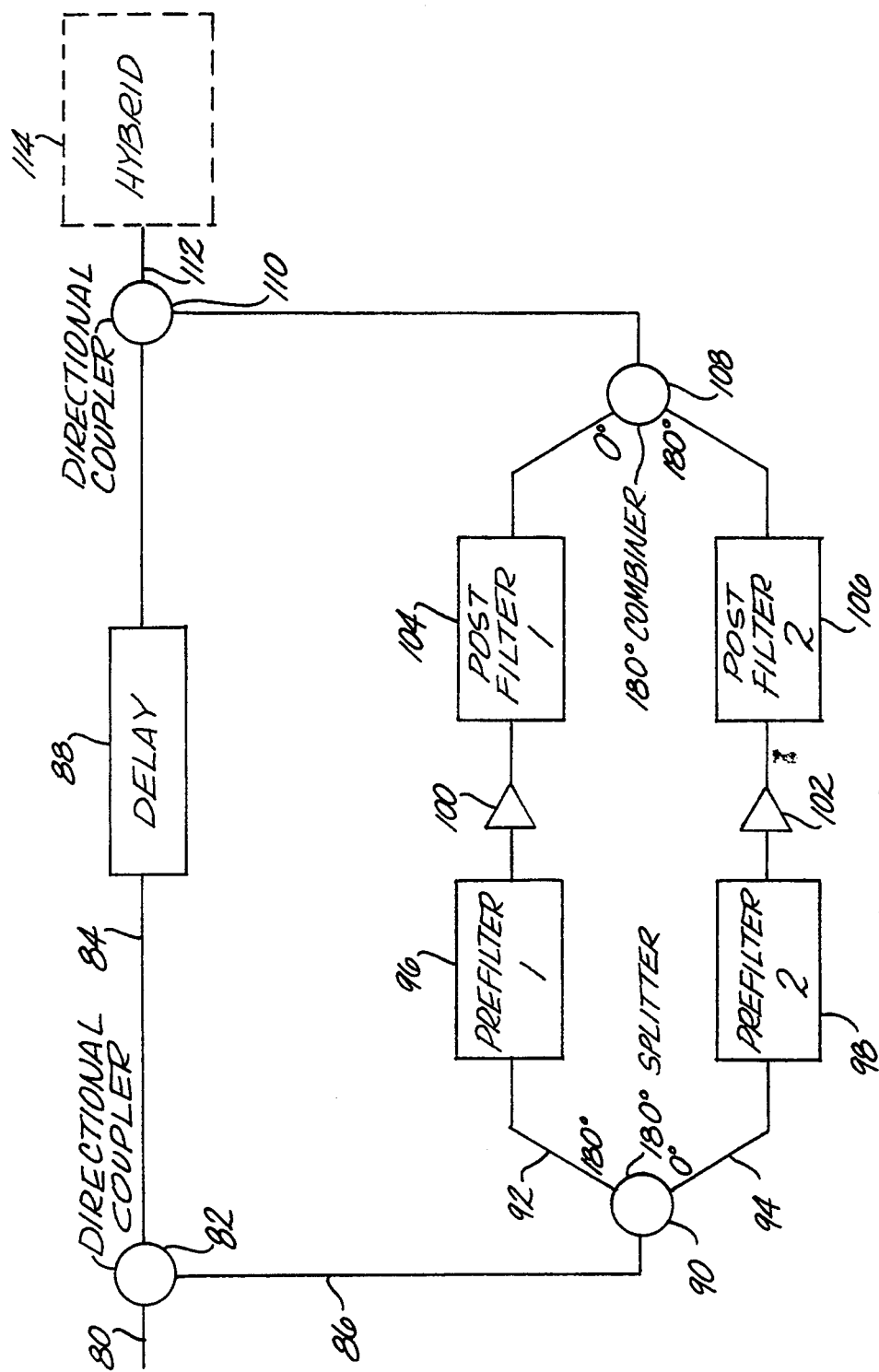
FIG. 3 is a block diagram of a second and third order linearizing push-pull amplifier according to the present invention.

An alternate embodiment of the present invention is shown in FIG. 3 for simultaneously linearizing second-order and third-order distortion using predistortion techniques. An input signal is applied to an input path 80, which is connected to a directional coupler 82. The directional coupler is connected to a primary electrical path 84 and a secondary electrical path 86. The primary electrical path comprises a delay block 88. In the secondary electrical path, or the predistortion branch, the directional coupler is connected to a 180° splitter 90. This splitter splits the input signal in the secondary path between first and second filter branches 92, 94. Each filter branch comprises a prefilter 96, 98 coupled to an amplifier 100, 102 and a postfilter 104, 106, respectively.

The filter branches are recombined using a 180° combiner 108. The output of the 180° combiner is coupled to the output of the delay block 88 via a second directional coupler 110. The output of the directional coupler 112 is connected to a hybrid amplifier 114 or other output device.

Ideally, the filters used simulate the non-ideal characteristics of the push-pull hybrid amplifier, splitters, and combiners and result in second-order distortion that matches that of the hybrid amplifier.

The prefilters are variable filters or other similar means which provide tilt adjustment by increasing the amplitude of the distortion at high frequencies, relative to distortion at lower frequencies, for an "up-tilt" and decreases amplitude at high frequencies for a "down-tilt." This adjustment may be done either manually or automatically. By passing more or less of the high-frequency distortion products than the low-frequency distortion products, the tilt adjustment in the prefilter enables the predistortion signal to be tailored more precisely to the inherent distortion characteristics of the hybrid amplifier. Up-tilt is usually needed for third-order distortion. The postfilters also adjust the tilt of the predistortion signal to match the frequency dependence of the distortion of the hybrid amplifier splitters and combiners within the predistortion circuit. The postfilter also contains an attenuator (not shown) for compensating for signal amplification caused by the push-pull device on the secondary path relative to the nonamplified signal on the primary path.

Since commercially employed hybrid amplifiers are relatively consistent in their distortion, little unit to unit adjustment of the predistorter is required.

Generation of the predistortion signal on the secondary electrical path typically involves a time delay relative to the primary electrical path. Before the primary and secondary paths are recombined, an adjustment is made to set the relative phase of the primary path electrical signal with respect to the phase of the secondary path electrical signal, which results in best cancellation of the distortion produced by the hybrid amplifier. This phase matching is done on the primary electrical path by the delay block 88, which receives the primary portion of the signal split by the directional coupler 82. The time delay may be manually or automatically adjusted. An example of a means for generating a delay may be simply a transmission line of selected length to introduce a suitable delay.

In practice, to achieve simultaneous second-order and third-order correction, the sum of the third-order distortion from the two halves of the push-pull distorter must match the hybrid third-order distortion, and the difference between the second-order distortion from the two arms must match the hybrid second-order distortion. This is not difficult to achieve with the circuit of FIG. 3.

With two prefilters and two postfilters in the push-pull arrangement, there are ample degrees of freedom to achieve excellent cancellation of both second-order and third-order distortion. In addition, unequal biasing of the amplifiers 100, 102 can also be used to aid in generating the correct level of second order distortion. The third-order distortions in the two halves of the push-pull amplifier are out of phase with each other. Thus, when recombined, the sum (or average) of the third-order distortions is output from the push-pull amplifier. In effect, there are four degrees of freedom in the predistortion branch due to the filters.

Many variations and modifications will be apparent to those skilled in the art without departing from the spirit and scope of the invention. For example, one or more of the filters in the predistortion circuit may be adjustable to provide desired degrees of freedom for predistortion.

What is claimed is:

1. A predistortion circuit for a hybrid amplifier comprising:
   a primary signal path;
   a secondary signal path;
   means for splitting an input signal between the primary and secondary signal paths and means for recombining signals from the primary and secondary signal paths for producing an input signal for a hybrid amplifier;
   a push-pull amplifier circuit in the secondary signal path comprising a first amplifier and a second amplifier;
   a filter connected to the first amplifier and a filter connected to the second amplifier for simultaneously adjusting second order distortion and third order distortion in the secondary path to match distortion in the hybrid amplifier; and
   a phase delay block in the primary signal path for controlling the phase relation between the primary and secondary signal paths.

2. A predistortion circuit as recited in claim 1 wherein the filter is connected to the first amplifier comprises:
   a prefilter connected to the input of the amplifier; and
   a postfilter connected to the output of the amplifier, each of the prefilter and the postfilter varying the amplitude of a signal as a function of frequency.

3. A predistortion circuit as recited in claim 1 wherein the filters comprise:
   a prefilter connected to the input of the first amplifier;
   a postfilter connected to the output of the first amplifier;
   a prefilter connected to the input of the second amplifier; and
   a postfilter connected to the output of the second amplifier, each of the prefilters and the postfilters varying the amplitude of a signal as a function of frequency.

4. A predistortion circuit recited in claim 3 wherein at least one prefilter is adjustable.

5. A predistortion circuit recited in claim 4 wherein at least one postfilter is adjustable.

6. A predistortion circuit as recited in claim 1 wherein the filter is connected to the first amplifier comprises:
   a prefilter connected to the input of the amplifier; and
   a postfilter connected to the output of the amplifier, each of the prefilter and the postfilter varying the phase of a signal as a function of frequency.

7. A predistortion circuit recited in claim 6 wherein at least one prefilter is adjustable.

8. A predistortion circuit as recited in claim 1 wherein the filters comprise:
   a prefilter connected to the input of the first amplifier;
   a postfilter connected to the output of the first amplifier;
   a prefilter connected to the input of the second amplifier; and
   a postfilter connected to the output of the second amplifier, each of the prefilters and the postfilters varying the phase of a signal as a function of frequency.

9. A predistortion circuit recited in claim 8 wherein at least one postfilter is adjustable.

10. A predistortion circuit as recited in claim 1 wherein the filter is connected to the first amplifier comprises:
    a prefilter connected to the input of the amplifier; and
    a postfilter connected to the output of the amplifier, each of the prefilter and the postfilter varying the amplitude and phase of a signal as a function of frequency.

11. A predistortion circuit recited in claim 10 wherein at least one prefilter is adjustable.

12. A predistortion circuit as recited in claim 1 wherein the filters comprise:
    a prefilter connected to the input of the first amplifier;
    a postfilter connected to the output of the first amplifier;
    a prefilter connected to the input of the second amplifier; and
    a postfilter connected to the output of the second amplifier, each of the prefilters and the postfilters varying the amplitude and phase of a signal as a function of frequency.

13. A predistortion circuit recited in claim 12 wherein at least one postfilter is adjustable.

* * * * *